US012777619B2

(12) United States Patent
Yarragunta et al.

(10) Patent No.: US 12,777,619 B2
(45) Date of Patent: Oct. 27, 2026

(54) UNIFIED SOLID-STATE DRIVE ENCLOSURE DESIGN

(71) Applicant: Micron Technology, Inc., Boise, ID (US)

(72) Inventors: Suresh Reddy Yarragunta, Bangalore (IN); Koneri Sathyanarayana Guptha Amith, Banaswadi (IN); Deepu Narasimiah Subhash, Yeshwanthpu (IN)

(73) Assignee: Micron Technology, Inc., Boise, ID (US)

( * ) Notice: Subject to any disclaimer, the term of this patent is extended or adjusted under 35 U.S.C. 154(b) by 401 days.

(21) Appl. No.: 18/374,421

(22) Filed: Sep. 28, 2023

(65) Prior Publication Data

US 2024/0114660 A1 Apr. 4, 2024

(30) Foreign Application Priority Data

Oct. 4, 2022 (IN) ............................ 202241056947

(51) Int. Cl.

*H05K 7/20* (2006.01)
*H05K 5/00* (2025.01)
*H05K 5/02* (2006.01)

(52) U.S. Cl.

CPC ......... *H05K 7/2039* (2013.01); *H05K 5/0047* (2013.01); *H05K 5/0213* (2013.01)

(58) Field of Classification Search

CPC ............. H05K 7/2039; H05K 7/20409; H05K 7/20436; H05K 5/0047; H05K 5/0213; G06F 1/20; G06F 1/203; G06F 1/1658; G06F 1/187; G06F 1/183; G11B 33/128; G11B 33/125; G11B 33/142; G11B 33/1406

See application file for complete search history.

(56) References Cited

U.S. PATENT DOCUMENTS 7,023,699 B2 * 4/2006 Glovatsky .......... H05K 7/20454 361/708
7,782,617 B2 * 8/2010 Li ............................ G06F 1/20 165/104.33

(Continued)

*Primary Examiner* — Adam B Dravininkas
(74) *Attorney, Agent, or Firm* — Schwegman Lundberg & Woessner, P.A.

(57) ABSTRACT

Example embodiments are directed to a solid-state drive (SSD) enclosure design that is adaptable for different printed circuit board assemblies (PCBA). The SSD enclosure design comprises a three-piece construction that includes a top enclosure, a bottom enclosure, and an intermediate structure. The bottom enclosure is coupled to the top enclosure to form a housing for a PCBA having NOT AND (NAND) devices and a controller. The intermediate structure is coupled to the PCBA and positioned between the top enclosure and the bottom enclosure within the housing. The intermediate structure comprises a plurality of heatsinks to transfer heat from the NAND devices and a controller heatsink to transfer heat from the controller, whereby the type and location of the heatsinks can be changed for a different PCBA without having to change the top enclosure or bottom enclosure. The top enclosure can include vents that allow air to flow through.

20 Claims, 6 Drawing Sheets

(56) References Cited

U.S. PATENT DOCUMENTS

| | | | | |
|---|---|---|---|---|
| 2002/0006027 | A1* | 1/2002 | Rodriguez | H05K 7/20909 361/688 |
| 2006/0132699 | A1* | 6/2006 | Cho | F04D 29/582 349/161 |
| 2011/0199748 | A1* | 8/2011 | Kagawa | H05K 7/20436 361/796 |
| 2012/0015006 | A1* | 1/2012 | Sommerich | A61L 27/24 514/17.2 |
| 2012/0281364 | A1* | 11/2012 | Gunderson | H05K 5/0269 361/714 |
| 2014/0036435 | A1* | 2/2014 | Kim | G06F 1/20 361/679.33 |
| 2015/0234437 | A1* | 8/2015 | Gallina | G06F 1/20 361/679.32 |
| 2016/0270261 | A1* | 9/2016 | Matsuda | G11B 33/1406 |
| 2017/0188473 | A1* | 6/2017 | Suzuki | H05K 5/0043 |
| 2017/0188477 | A1* | 6/2017 | Matsuda | H05K 1/144 |
| 2017/0220505 | A1* | 8/2017 | Breakstone | G06F 13/4282 |
| 2020/0008292 | A1* | 1/2020 | Sato | B29C 45/14336 |
| 2020/0135616 | A1* | 4/2020 | Forsnes | H01L 23/538 |
| 2020/0154606 | A1* | 5/2020 | Hur | H05K 5/30 |
| 2020/0174533 | A1* | 6/2020 | Long | H05K 7/20145 |
| 2024/0046965 | A1* | 2/2024 | Awaga | H05K 1/0203 |

* cited by examiner

UNIFIED SOLID-STATE DRIVE ENCLOSURE DESIGN

PRIORITY APPLICATION

This application claims the benefit of priority to Indian Patent Application Serial Number 202241056947, filed Oct. 4, 2022, which is incorporated herein by reference in its entirety.

TECHNICAL FIELD

The subject matter disclosed herein generally relates to a solid-state drive (SSD) enclosure design and more specifically to a reusable SSD enclosure design that can be used with any printed circuit board assembly (PCBA) design.

BACKGROUND

Currently, U.2 and U.3 solid-state drive (SSD) enclosures are each designed to work efficiently for a specific printed circuit board assembly (PCBA) design and drive capacity. If critical component locations are altered, for example, due to routing constraints in electrical design for higher performance or various capacity drives, these SSD enclosures will have to be redesigned to adapt to new component locations and/or work efficiently for higher thermal performance.

The conventional enclosure design approach has adverse effects on product life cycle and many disadvantages. For instance, most of the conventional SSD enclosures are manufactured using a die casting manufacturing method which typically requires a minimum of eight to ten weeks lead-time for development. Thus, any SSD enclosure redesign or modification will require addition lead-time and increase enclosure non-recurring engineering (NRE) cost, product cost, and time to market. Further still, die casting manufacturing can also lead to heavier enclosures.

BRIEF DESCRIPTION OF THE DRAWINGS

Some embodiments are illustrated by way of example and not limitation in the figures of the accompanying drawings.

DETAILED DESCRIPTION

Figure 1A:
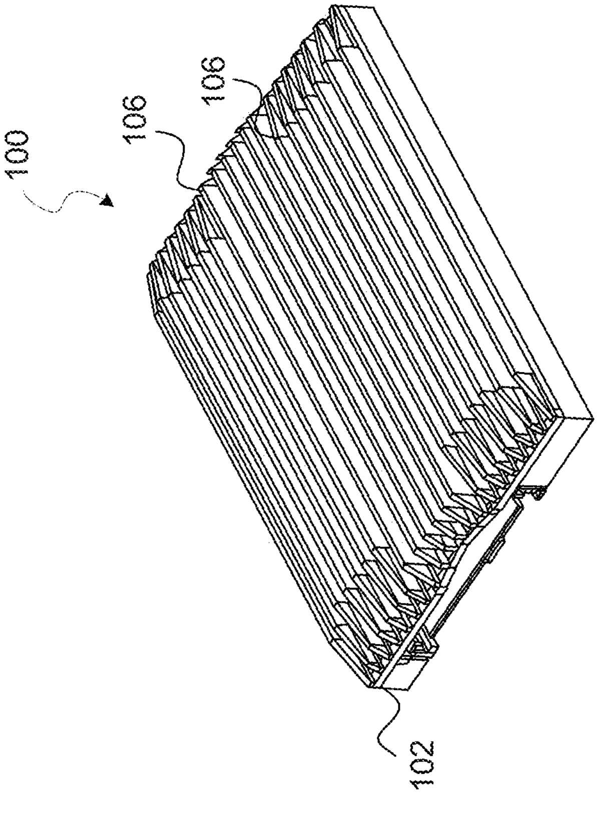
FIG. 1A PRIOR ART
FIG. 1A and FIG. 1B are diagrams illustrating a conventional solid-state drive (SSD) enclosure.

The description that follows describes systems, methods, techniques, and products that illustrate example embodiments of the present subject matter. In the following description, for purposes of explanation, numerous specific details are set forth in order to provide an understanding of various embodiments of the present subject matter. It will be evident, however, to those skilled in the art, that embodiments of the present subject matter may be practiced without some or other of these specific details. Examples merely typify possible variations. Unless explicitly stated otherwise, structures (e.g., structural components) are optional and may be combined or subdivided, and operations (e.g., in a procedure, algorithm, or other function) may vary in sequence or be combined or subdivided.

Example embodiments are directed to a unified or common SSD enclosure design or assembly (also referred to herein as a "unified SSD enclosure" or "unified enclosure") that is thermally efficient and adaptable for various PCBAs, drive capacities, and performance. The unified SSD enclosure design is "common" or "unified" in that at least a portion, is reusable for different component locations and thermal requirements, which avoids enclosure redesign efforts and lead-time manufacturing issues. Specifically, a top enclosure component and a bottom enclosure component forming the enclosure or housing are reusable with different PCBAs having different components and different component locations. That is, the top enclosure component and the bottom enclosure component do not change. Instead of changing a design of the enclosure, an intermediate design structure (also referred to herein as "intermediate structure") is positioned within the enclosure which can be customized to the components on the PCBA and their locations. In example embodiments, the intermediate design structure comprises a plurality of heatsinks that can be configured to the different components on the PCBA. In some embodiments, the intermediate design structure can utilize common or off-the-shelf heat sinks. As a result, example embodiments are thermally effective for any PCBA component placement and thermal requirement.

In example embodiments, the unified SSD enclosure design reduces design complexity (e.g., simplifies the design). Specifically, example embodiments reuse a common or unified enclosure to minimize design and manufacturing lead time (e.g., time to market due to adaptability to multiple drive capacities). Example embodiments may also reduce development and tool time and cost by eliminating the die casting process.

The reusable, unified SSD enclosure design also provides the technical advantage of improving overall drive thermal performance. For instance, the intermediate design structure is thermally efficient and helps to reduce weight of the thermal solution. Weight of the SSD can also be reduced by using a stamping method to manufacture the enclosure instead of using die-casting. Further still, the unified SSD enclosure design can solve overheating issues in fan failed scenarios due to less flow impedance. The unified SSD enclosure works efficiently for all airflow conditions, including low fan speed or fan failure, due to the intermediate design structure as will be discussed further below.

A further technical advantage of the unified SSD enclosure design is that the unified SSD enclosure design provides improved thermal isolation and heat balance between a controller and NAND (NOT AND) devices. Some example embodiments disconnect NAND and controller thermal ground planes to prevent heating issues due to, for example, application-specific integrated circuit (ASIC). These and other advantages will be discussed in further detail below.

Figure 1B:
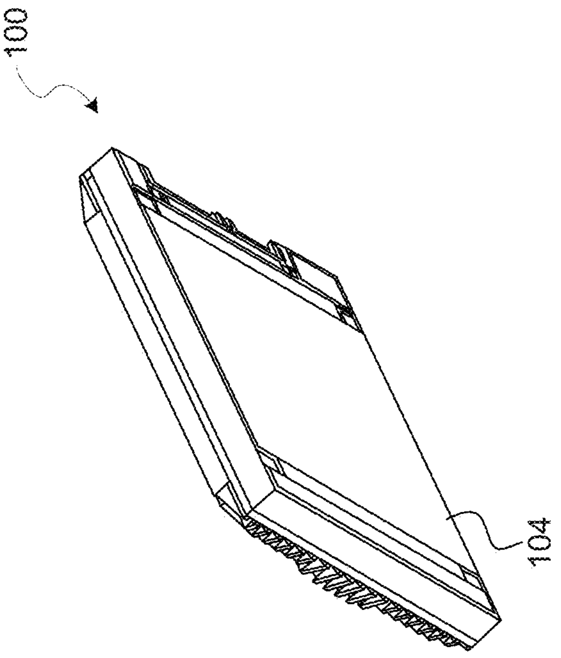
FIG. 1B PRIOR ART

FIG. 1A and FIG. 1B are diagrams illustrating a conventional or prior art solid-state drive (SSD) enclosure 100. The conventional SSD enclosure 100 is a two-piece construction that includes a top enclosure component 102 and a bottom enclosure component 104 that couple together to form the SSD enclosure 100. The top enclosure component 102 comprises a plurality of fins 106 extending vertical from a top surface of the top enclosure component 102. The plurality of fins function as a heatsink. As such, the plurality of fins 106 is also referred to as a top heatsink. The plurality of fins 106 assist in transferring heat from the conventional SSD enclosure 100 to the external environment. In various cases, heat is also transferred through the bottom enclosure component 104.

Figure 1C:
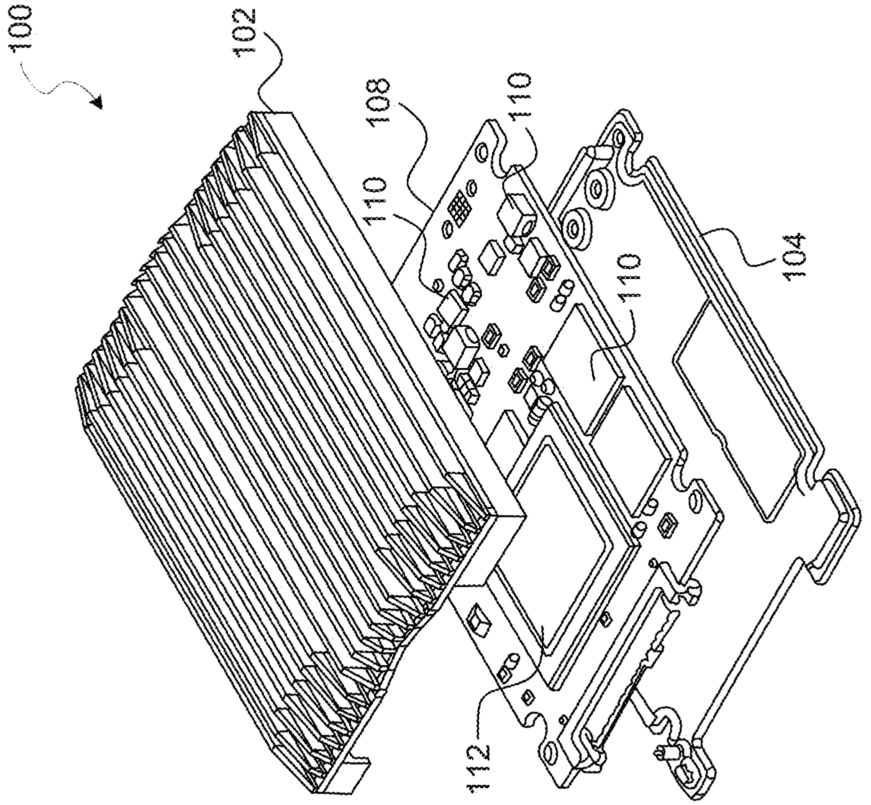
FIG. 1C PRIOR ART
FIG. 1C is a diagram illustrating an expanded view of the components associated with the conventional SSD enclosure.

As previously discussed, a disadvantage of the conventional SSD enclosure 100 is that it needs to be specifically designed for each printed circuit board assembly (PCBA) so that, for each PCBA, a specific enclosure is created. Referring now to FIG. 1C, a diagram illustrating an expanded view of the components within the conventional SSD enclosure 100 is shown. Between the top enclosure component 102 and the bottom enclosure component 104 is a PCBA 108 with a plurality of components mounted thereon. The plurality of components include various NAND devices 110 and a controller 112. If components of the PCBA 108 change or locations of the components change, the conventional SSD enclosure 100 will need to be redesigned. Redesign will cause a delay in the manufacturing process taking weeks or more of manufacturing and design efforts.

Typically, the top enclosure component 102 and the plurality of fins 106 (e.g., the top heatsink) are responsible for transferring heat from the NAND devices 110 and the controller 112. Usually, the NAND devices 110 and the controller 112 are thermally connected to the top heatsink in order for the top heatsink to dissipate the heat therefrom. Specifically, the heat from the NAND devices 110 and the controller 112 is dissipated through the plurality of fins 106. In these conventional embodiments, because all the components are thermally connected to the top heatsink, the controller 112 can cause the NAND devices 110 to overheat such that the NAND devices 110 cannot function properly at higher temperatures.

Further still, the conventional SSD enclosure 100 is typically manufactured, at least in part, by die-casting. That is the top enclosure component 102 and the bottom enclosure component 104 can be die-casted. In some cases, the bottom enclosure component 104 may be stamped. Disadvantageously, materials used for die-casting of the conventional SSD enclosure 100 usually has a low thermal conductivity. Further still, die-casting can result in a thicker and heavier enclosure.

To address the disadvantages of the conventional SSD enclosure 100, example embodiments provide a common or unified SSD enclosure design that can be used for any kind or design of a PCBA (e.g., any printed circuit board (PCB) variant). By using the unified SSD enclosure, no manufacturing or redesign down time is incurred. The reuse of the SSD enclosure also provides the added benefit of reducing manufacturing costs. Additional advantages will be discussed further below.

Figure 2B:
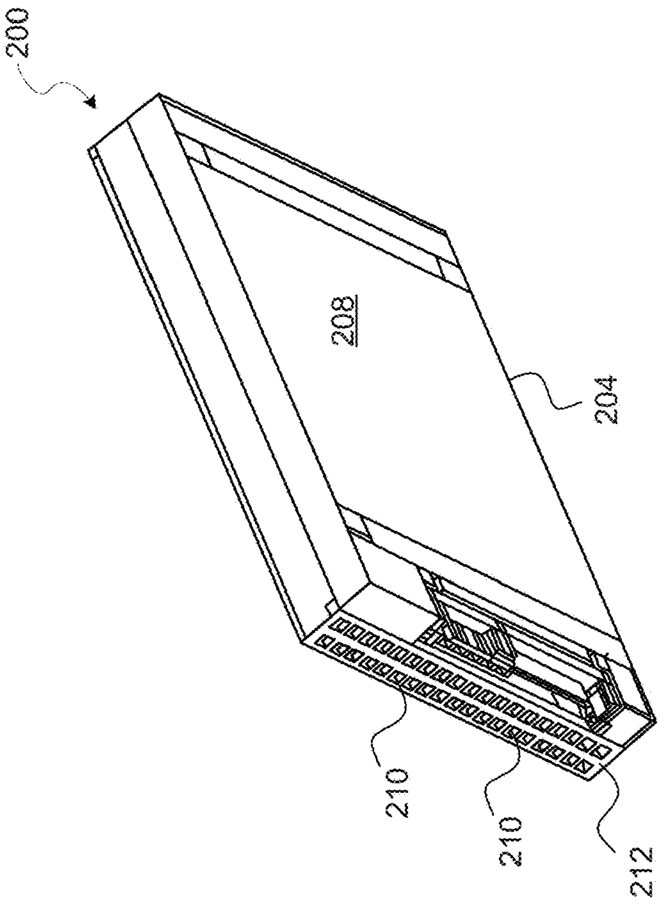
FIG. 2A and FIG. 2B are diagrams illustrating a unified SSD enclosure design, according to some example embodiments.
Figure 2A:
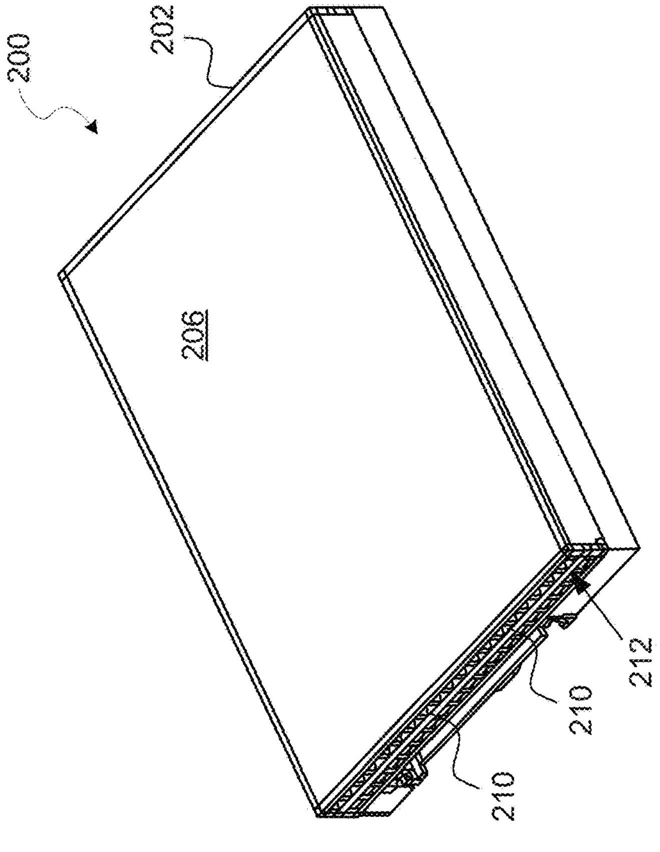

FIG. 2A and FIG. 2B are diagrams illustrating a unified or common SSD enclosure design 200, according to some example embodiments. The unified SSD enclosure design 200 comprise a three-piece construction that includes a top enclosure component 202 (also referred to herein as "top enclosure") and a bottom enclosure component 204 (also referred to herein as "bottom enclosure") that couple together to form a housing for the PCBA and an intermediate structure (not shown) between the top enclosure 202 and the bottom enclosure 204. In example embodiments, the top enclosure 202 and the bottom enclosure 204 are standard for any PCBA configuration and will not vary if any PCBA components change or locations of the PCBA components change.

Unlike, the conventional top enclosure component 102, the top enclosure 202 has a flat top surface 206 (e.g., there is no exterior heatsink). Similarly, the bottom enclosure 204 has a flat bottom surface 208. By having the flat top surface 206 and flat bottom surface 208, the top enclosure 202 and the bottom enclosure 204 can be manufactured using a stamping method as opposed to the die-cast method used in the conventional SSD enclosure 100. An advantage of using the stamping method is that the overall weight of the unified SSD enclosure design 200 and the SSD will be lighter. This is a result of using lighter materials such as, for example, aluminum, and by having a thinner thickness (e.g., 1 mm thickness) that is made possible by using the stamping method over the conventional die-casting method.

In example embodiments, the top enclosure 202 comprises a plurality of vents 210 on a front surface 212 and a rear surface (not shown). The plurality of vents 210 allow air to flow through the enclosure or housing of the unified SSD enclosure design 200. Thus, the unified SSD enclosure design 200 allows air to pass over the top surface 206, the bottom surface 208, and through the interior of the enclosure. Advantageously, passing air through the interior of the enclosure cools the PCBA, the intermediate structure, and small components which are not or cannot be connected to the bottom enclosure 204 and/or the top enclosure 202. These small components may be critical for a design and the air passing over the small components transfers the heat from the small components such that heatsinking is not necessary for these small components. In some embodiments, the bottom enclosure 204 can also include vents.

Figure 3B:
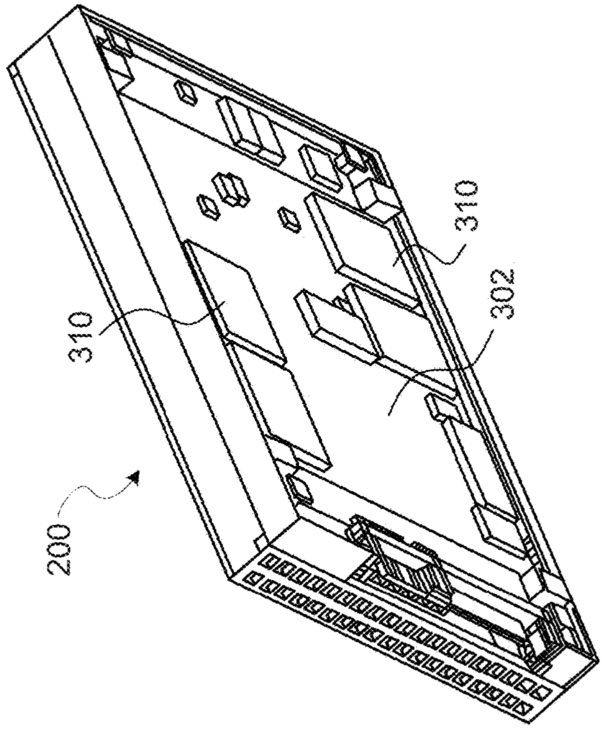
FIG. 3B is a diagram illustrating a bottom perspective view of the unified SSD enclosure design with a bottom surface removed to show the PCBA enclosed therein, according to some example embodiments.
Figure 3A:
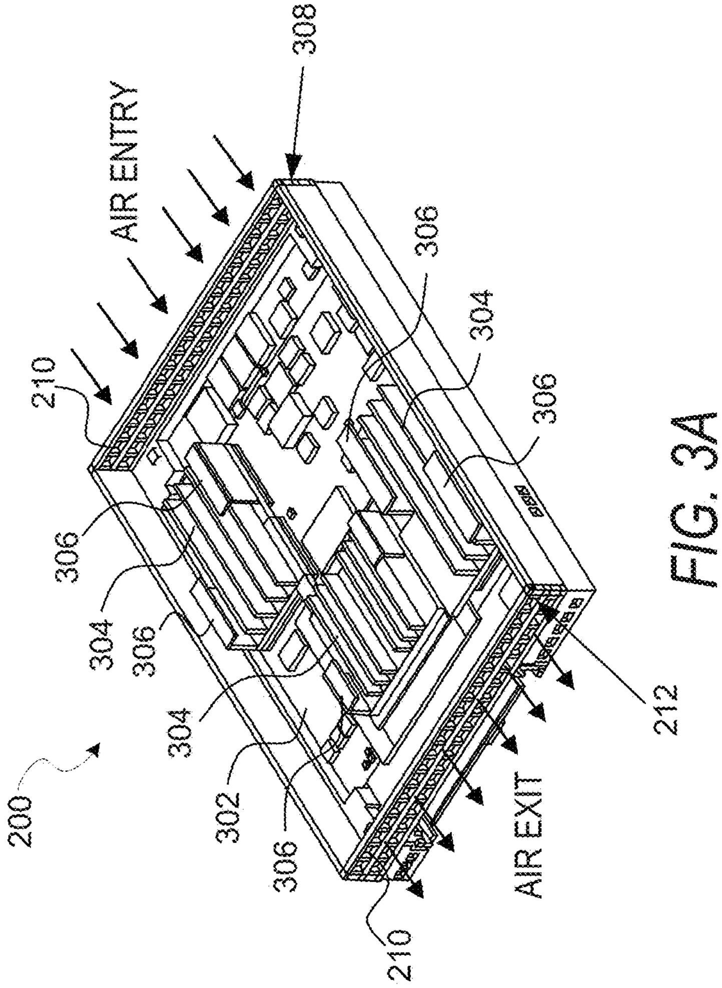
FIG. 3A is a diagram illustrating a top perspective view of the unified SSD enclosure design with a top surface removed to show a printed circuit board assembly (PCBA) having an intermediate structure coupled thereto, according to some example embodiments.

FIG. 3A is a diagram illustrating a top perspective view of an example embodiment of the unified SSD enclosure design 200 with the top surface 206 removed to show a printed circuit board assembly (PCBA) 302 having an intermediate structure coupled thereto. The intermediate structure shown in FIG. 3A comprises heatsinks 304 that transfer heat from critical components (e.g., NAND devices and the controller) without modifying the main SSD enclosure (e.g., the top enclosure 202 and the bottom enclosure 204). In some embodiments, the heatsinks 304 are reusable (e.g., common or off-the-shelf). In other embodiments, the heatsinks 304 are customized to the critical components of the PCBA 302.

The heatsinks 304 of the intermediate structure comprise a fin structure that transfers heat to the top enclosure 202. Primary ends 306 of the heatsinks 304 are connected to the top enclosure 202 (e.g., the top surface 206 of the top enclosure 202). For example, the primary ends 306 can be connected via welding or adhesive bonding to the top surface 206. Secondary ends (e.g., opposite of the primary ends 306) of the heatsinks 304 touch the critical components, for example, using thermal interface material (e.g., thermal paste, thermal adhesive, thermal gap filler, thermally conductive pad, thermal tape, phase-change materials).

In example embodiments, the intermediate structure (e.g., the heatsinks 304) is a stamped metal structure. Using the stamping method, the intermediate structure can be manufactured in less time and less cost. The intermediate structure can be manufactured, for example, using aluminum or copper. The material used as well as the dimensions of the heatsinks 304 depends on design needs and the critical components from which heat is to be transferred. Thus, the intermediate structure can be customized to every PCB variant and driver capacity without changing the top enclosure 202 and bottom enclosure 204.

Shown more clearly in FIG. 3A are the plurality of vents 210 on the front surface 212 and a rear surface 308. The plurality of vents 210 allow for airflow through the SSD enclosure and over the PCBA 302 and heatsinks 304. This ensures removal of heat from a PCB surface, PCBA components, and the heatsinks 304 and no stagnant heated air inside the SSD enclosure. Thus, the airflow can provide adequate cooling for small components (e.g., power management integrated circuit (PMIC), memory, inductors, capacitors). Advantageously, this avoids usage of thermal interface material to connect the small components to the heatsinks 304 and avoids the need for additional heatsinks dedicated to these small components.

FIG. 3B is a diagram illustrating a bottom perspective view of the unified SSD enclosure design 200 with the bottom surface 208 removed to show a bottom of the PCBA 302 enclosed therein, according to some example embodiments. As can be seen, portions of various components (e.g., NAND devices 310) are shown. In some cases, the NAND devices 310 can be thermally connected (e.g., via thermal interface material) to the bottom enclosure 204 (e.g., the bottom surface 208) to transfer heat from the NAND components 310 to the bottom enclosure 204.

Figure 3C:
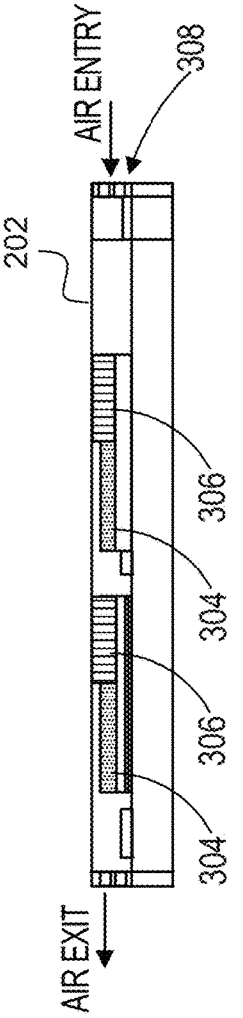
FIG. 3C is a diagram illustrating a side cutaway view of the unified SSD enclosure design, according to some example embodiments.

The embodiment shown in FIG. 3A comprises the heatsinks 304 thermally connected (via the primary ends 306) to the top enclosure 202. This is illustrated as shown in FIG. 3C which is a diagram illustrating a side cutaway view of the unified SSD enclosure design 200, according to some example embodiments. Typically, the controller has the highest concentration of heat. That heat can potentially be passed to other components, such as the NAND devices 310 through the heatsinks 304. As such, it may be advantageous to disconnect heatsinks that transfer heat from the NAND devices from a heatsink that transfers heat from the controller.

Figure 4A:
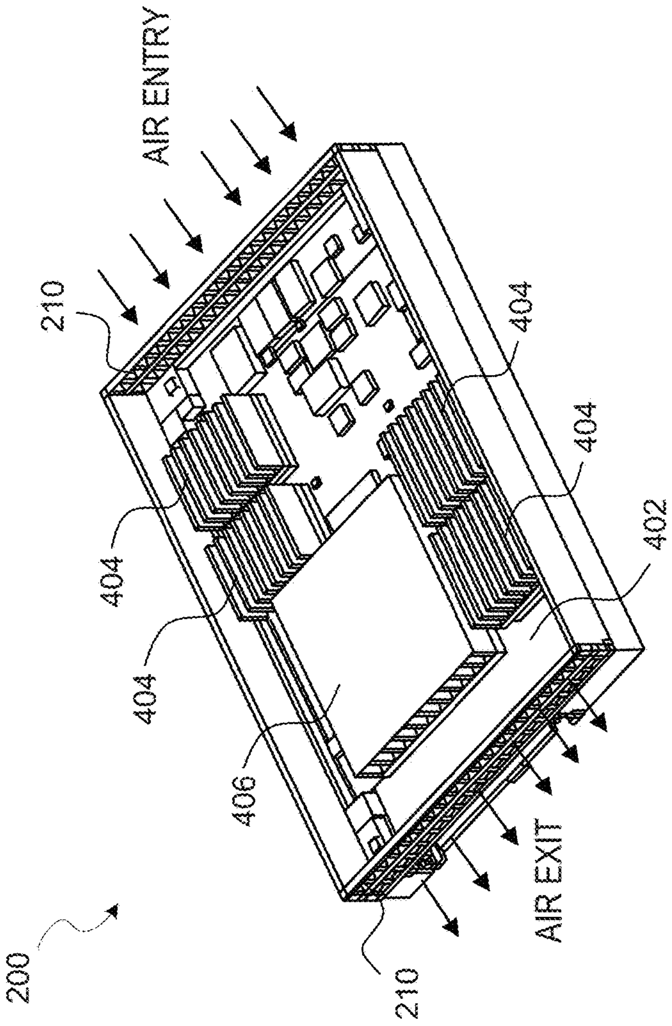
FIG. 4A is a diagram illustrating a top perspective view of the unified SSD enclosure design with the top surface removed to show a PCBA having an alternative intermediate structure coupled thereto, according to some example embodiments.

FIG. 4A is a diagram illustrating a top perspective view of the unified SSD enclosure design 200 with the top surface 206 removed to show a PCBA 402 having an alternative intermediate structure coupled thereto, according to some example embodiments. In some embodiments, the intermediate structure of FIG. 4A can use off-the-shelf and/or custom heatsinks 404. For example, standard or off-the-shelf heatsinks 404 can be used for individual critical components of the PCBA 402 such as NAND devices. The use of off-the-shelf heatsinks 404 are typically less expensive and require little time in the manufacturing process. Alternatively, the heatsinks 404 can be manufactured using an extrusion or stamping process.

Figure 4B:
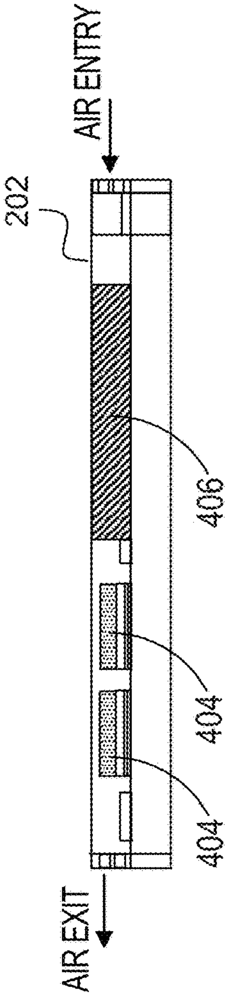
FIG. 4B is a diagram illustrating a side cutaway view of the unified SSD enclosure design, according to some example embodiments.

A controller heatsink 406 is configured to transfer heat from the controller or other high-powered component (e.g., ASIC). In some embodiments, the controller heatsink 406 is connected or welded to the top enclosure 202 (e.g., the top surface 206). Thus, a portion of the heat from the controller is transferred to, and dissipated through, the top enclosure 202. This is illustrated in FIG. 4B, which is a diagram illustrating a side cutaway view of the unified SSD enclosure design 200, according to some example embodiments. Another portion of the heat may be transferred through the air that flows through the SSD enclosure via the plurality of vents 210 in the top enclosure 202.

Unlike the embodiment of FIG. 3A, the heatsinks 404 for the NAND devices (or other critical components excluding the controller) are isolated (e.g., disconnected) from the top enclosure 202 while the controller heatsink 406 is thermally connected to the top enclosure 202. By isolating the heatsinks 404 dissipating heat from the NAND devices from the top enclosure 202 (e.g., not connecting the heatsinks 404 to the top enclosure 202), the NAND devices will not be transferred any heat from the controller or the controller heatsink 406. In these embodiments, air flowing through the plurality of vents 210 cool the heatsinks 404 dissipating the heat from the NAND devices or the other critical components.

In example embodiments, a bottom of the PCBA 402 in the embodiment of FIG. 4A may be the same as that shown in FIG. 3B. Accordingly, various components (e.g., the NAND devices) can be thermally connected to the bottom enclosure 204 (e.g., the bottom surface 208) to transfer heat from these components to the bottom enclosure 204.

Both embodiments of FIG. 3A and FIG. 4A provide a common or unified SSD enclosure design 200 having a top enclosure 202 and a bottom enclosure 204 that are reusable with different PCBAs having different components and different component locations. That is, the top enclosure 202 and the bottom enclosure 204 are common and do not change. Instead, an intermediate structure is configured or adapted to the different PCBA components and PCBA component locations. The intermediate structure comprises a plurality of individual heatsinks that transfer heat from, for example, the NAND devices and the controller. In one embodiment, the heatsinks for the NAND devices are connected to the top enclosure (e.g., the embodiment of FIG. 3A). In an alternative embodiment, the heatsinks for the NAND devices are isolated from (e.g., not connected to) the top enclosure (e.g., the embodiment of FIG. 4A). In both embodiments, the controller heatsink is thermally connected to the top enclosure and transfers at least a portion of the heat from the controller through the top enclosure 202.

Figure 5:
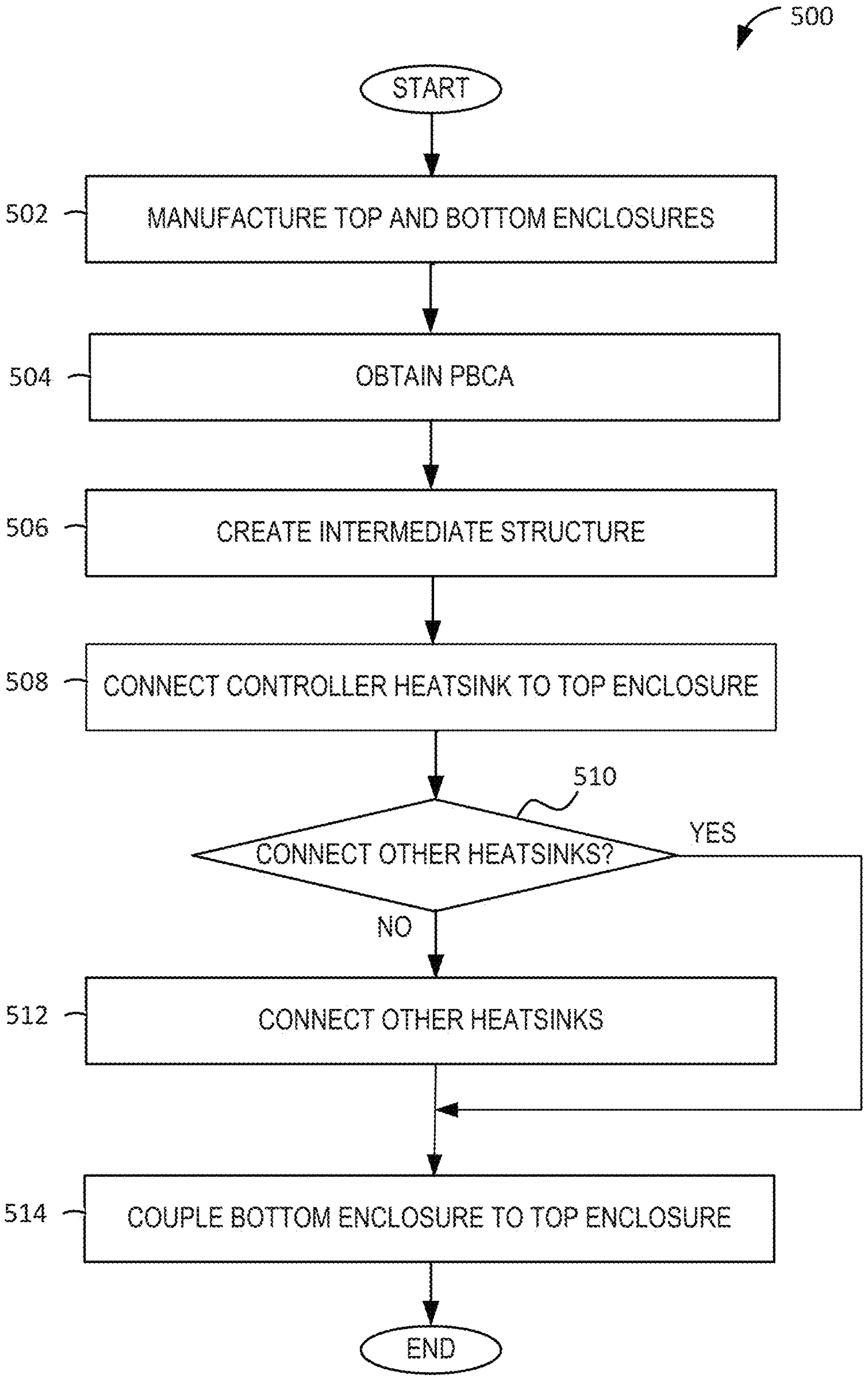
FIG. 5 is a flowchart of a method for manufacturing a SSD using the unified SSD enclosure design, according to some example embodiments.

FIG. 5 is a flowchart of a method 500 for manufacturing a SSD using a unified SSD enclosure design, according to some example embodiments. In operation 502, top and bottom enclosures are manufactured. Because the top and bottom enclosures will not change regardless of the PBCA, the top and bottom enclosures can be mass produced. In example embodiments, the top and bottom enclosures are manufactured using a stamping process. In one embodiment, the material used to create the top and bottom enclosure is aluminum.

In operation 504, a PBCA to be housed within the SSD is obtained. Based on the design of the PBCA and the critical components (e.g., NAND devices, controller) a customized intermediate structure is created in operation 506. In example embodiments, the customized intermediate structure is created by thermally coupling heatsinks to the critical components of the PBCA. For instance, the heatsinks touch the critical components via thermal interface material (e.g., thermal paste, thermal adhesive, thermal gap filler, thermally conductive pad, thermal tape, phase-change materials). In some cases, the heatsinks are off-the-shelf heatsinks while in other cases, the heatsinks may be customized to the size, shape, and heat output of the critical components. The heatsinks may be manufactured using a stamping process.

In operation 508, a controller heatsink of the intermediate structure is connected to the top enclosure. For example, the controller heatsink can be connected via welding or adhesive bonding to a top surface of the top enclosure.

In operation 510, a determination is made whether to connect the other heatsinks (e.g., heatsinks for the NAND devices) to the top enclosure. In the embodiment of FIG. 3A, the other heatsinks are connected to the top enclosure, while the embodiment of FIG. 4A does not connect the other heatsinks to the top enclosure. If the other heatsinks are to be connected, then in operation 512, the other heatsinks are connected (e.g., via welding or adhesive bonding).

In operation 514, the bottom enclosure is coupled to the top enclosure to form the housing for the PCBA. For example, the bottom enclosure and the top enclosure can be coupled together using screws or other types of fasteners.

Should the design of the PCBA change, the same top and bottom enclosures can still be used (e.g., assuming dimensions of the PCB are relatively the same). Any change in critical components or their locations on the PCBA can be adapted to by changing the intermediate structure (e.g., changing one or more heatsinks and/or location of one or more heatsinks). For instance, corresponding heatsinks can be moved or replaced with other heatsinks more suitable for the new critical components.

While example embodiments are discussed having NAND devices, alternative embodiments can include other devices in addition to the NAND devices. For instance, the PCBA housed within the enclosure design may include one or more dynamic random access memory (DRAM) devices or similar types of memory devices.

Throughout this specification, plural instances may implement components, operations, or structures described as a single instance. Conversely, single instances can be implements as plural instances. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

In view of the disclosure above, various examples are set forth below. It should be noted that one or more features of an example, taken in isolation or combination, should be considered within the disclosure of this application.

Example 1 is a solid-state drive (SSD) comprising an enclosure design and a printed circuit board assembly (PCBA) having a plurality of NOT AND (NAND) devices and a controller. The enclosure design comprises a top enclosure, a bottom enclosure coupled to the top enclosure to form a housing for the PCBA, and an adaptable intermediate structure coupled to the PCBA and positioned between the top enclosure and the bottom enclosure within the housing. The adaptable intermediate structure comprises a plurality of heatsinks to transfer heat from the NAND devices and a controller heatsink to transfer heat from the controller.

In example 2, the subject matter of example 1 can optionally include wherein one or more of the plurality of heatsinks are thermally connected to the top enclosure; and the controller heatsink is thermally connected to the top enclosure.

In example 3, the subject matter of any of examples 1-2 can optionally include wherein the plurality of heatsinks are detached from the top enclosure; and the controller heatsink is thermally connected to the top enclosure.

In example 4, the subject matter of any of examples 1-3 can optionally include wherein the top enclosure comprises a plurality of vents located in a front surface and a rear surface of the top enclosure, the plurality of vents configured to allow air to flow through an interior of the housing.

In example 5, the subject matter of any of examples 1~4 can optionally include wherein the top enclosure and the bottom enclosure are manufactured using a stamping process.

In example 6, the subject matter of any of examples 1-5 can optionally include wherein an exterior, top surface of the top enclosure is devoid of a heatsink and is flat.

In example 7, the subject matter of any of examples 1-6 can optionally include wherein the adaptable intermediate structure is configured for a different PCBA by changing a location of at least one heatsink of the plurality of heatsinks.

In example 8, the subject matter of any of examples 1-7 can optionally include wherein the adaptable intermediate structure is configured for a different PCBA by changing at least one heatsink of the plurality of heatsinks.

Example 9 is an enclosure design comprising a top enclosure, a bottom enclosure, and an adaptable intermediate structure. The bottom enclosure is coupled to the top enclosure to form a housing for a printed circuit board assembly (PCBA) having a plurality of NOT AND (NAND) devices and a controller. The adaptable intermediate structure is coupled to the PCBA and positioned between the top enclosure and the bottom enclosure within the housing. The adaptable intermediate structure comprises a plurality of heatsinks to transfer heat from the NAND devices and a controller heatsink to transfer heat from the controller.

In example 10, the subject matter of example 9 can optionally include wherein one or more of the plurality of heatsinks are thermally connected to the top enclosure; and the controller heatsink is thermally connected to the top enclosure.

In example 11, the subject matter of any of examples 9-10 can optionally include wherein the plurality of heatsinks are detached from the top enclosure; and the controller heatsink is thermally connected to the top enclosure.

In example 12, the subject matter of any of examples 9-11 can optionally include wherein the top enclosure comprises a plurality of vents located in a front surface and a rear surface of the top enclosure, the plurality of vents configured to allow air to flow through an interior of the housing.

In example 13, the subject matter of any of examples 9-12 can optionally include wherein the top enclosure and the bottom enclosure are manufactured using a stamping process.

In example 14, the subject matter of any of examples 9-13 can optionally include wherein an exterior, top surface of the top enclosure is devoid of a heatsink and is flat.

In example 15, the subject matter of any of examples 9-14 can optionally include wherein the adaptable intermediate structure is configured for a different PCBA by changing a location of at least one heatsink of the plurality of heatsinks.

In example 16, the subject matter of any of examples 9-15 can optionally include wherein the adaptable intermediate structure is configured for a different PCBA by changing at least one heatsink of the plurality of heatsinks.

Example 17 is a method for constructing a solid-state drive (SSD) using a unified SSD enclosure design. The method comprises obtaining a printed circuit board assembly (PCBA) having a plurality of NOT AND (NAND) devices and a controller; creating an adaptable intermediate structure, the creating the adaptable intermediate structure comprising thermally connecting a plurality of heatsinks to the NAND devices and a controller heatsink to the controller; thermally connecting the controller heatsink to a top enclosure; and coupling a bottom enclosure to the top enclosure to form a housing for the PCBA.

In example 18, the subject matter of example 17 can optionally include thermally connecting one or more of the plurality of heatsinks to the top enclosure.

In example 19, the subject matter of any of examples 17-18 can optionally include wherein the top enclosure comprises a plurality of vents located in a front surface and a rear surface, the plurality of vents configured to allow air to flow through an interior of the housing.

In example 20, the subject matter of any of examples 17-19 can optionally include using a same top enclosure design as the top enclosure and a same bottom enclosure design as the bottom enclosure for a different PCBA having at least one different NAND device or a different controller or having a different location for at least one of the plurality of NAND devices or the controller by creating a new intermediate structure customized to the different PCBA.

The embodiments illustrated herein are believed to be described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present invention. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present invention as represented by the appended claims. The specification and drawings are, accordingly, to be regarded in an illustrative rather than a restrictive sense.

What is claimed is:

1. A solid-state drive comprising:

a printed circuit board assembly (PCBA) having a plurality of NOT AND (NAND) devices and a controller; and an enclosure design comprising:

a top enclosure;

a bottom enclosure coupled to the top enclosure to form a housing for the PCBA; and an adaptable intermediate structure coupled to the PCBA and positioned between the top enclosure and the bottom enclosure within the housing, the adaptable intermediate structure comprising a plurality of heatsinks to transfer heat from the NAND devices and a controller heatsink that is thermally connected to the top enclosure to transfer heat from the controller;

the top enclosure and the bottom enclosure remaining unchanged for different PCBA configurations and the adaptable intermediate structure configured to accommodate the different PCBA configurations by adapting at least one of the plurality of heatsinks or a location of at least one of the plurality of heatsinks without changing the top enclosure or the bottom enclosure.

2. The solid-state drive of claim 1, wherein:

one or more of the plurality of heatsinks are thermally connected to the top enclosure.

3. The solid-state drive of claim 1, wherein:

the plurality of heatsinks are detached from the top enclosure.

4. The solid-state drive of claim 1, wherein the top enclosure comprises a plurality of vents located in a front surface and a rear surface of the top enclosure, the plurality of vents configured to allow air to flow through an interior of the housing.

5. The solid-state drive of claim 1, wherein the top enclosure and the bottom enclosure are manufactured using a stamping process.

6. The solid-state drive of claim 1, wherein an exterior, top surface of the top enclosure is devoid of a heatsink and is flat.

7. The solid-state drive of claim 1, wherein the adaptable intermediate structure is configured for a different PCBA by changing the location of the at least one of the plurality of heatsinks to correspond to a location of at least one NAND device on the different PCBA.

8. The solid-state drive of claim 1, wherein the adaptable intermediate structure is configured for a different PCBA by changing the at least one of the plurality of heatsinks to a heatsink having at least one of a different size, shape, or heat dissipation capacity corresponding to a different NAND device on the different PCBA.

9. An enclosure design comprising:

a top enclosure;

a bottom enclosure coupled to the top enclosure to form a housing for a printed circuit board assembly (PCBA) having a plurality of NOT AND (NAND) devices and a controller; and an adaptable intermediate structure coupled to the PCBA and positioned between the top enclosure and the bottom enclosure within the housing, the adaptable intermediate structure comprising a plurality of heatsinks to transfer heat from the NAND devices and a controller heatsink that is thermally connected to the top enclosure to transfer heat from the controller;

the top enclosure and the bottom enclosure remaining unchanged for different PCBA configurations and the adaptable intermediate structure configured to accommodate the different PCBA configurations by adapting at least one of the plurality of heatsinks or a location of at least one of the plurality of heatsinks without changing the top enclosure or the bottom enclosure.

10. The enclosure design of claim 9, wherein:

one or more of the plurality of heatsinks are thermally connected to the top enclosure.

11. The enclosure design of claim 9, wherein:

the plurality of heatsinks are detached from the top enclosure.

12. The enclosure design of claim 9, wherein the top enclosure comprises a plurality of vents located in a front surface and a rear surface of the top enclosure, the plurality of vents configured to allow air to flow through an interior of the housing.

13. The enclosure design of claim 9, wherein the top enclosure and the bottom enclosure are manufactured using a stamping process.

14. The enclosure design of claim 9, wherein an exterior, top surface of the top enclosure is devoid of a heatsink and is flat.

15. The enclosure design of claim 9, wherein the adaptable intermediate structure is configured for a different PCBA by changing the location of the at least one of the plurality of heatsinks to correspond to a location of at least one NAND device on the different PCBA.

16. The enclosure design of claim 9, wherein the adaptable intermediate structure is configured for a different PCBA by changing the at least one of the plurality of heatsinks to a heatsink having at least one of a different size, shape, or heat dissipation capacity corresponding to a different NAND device on the different PCBA.

17. A method for constructing a solid-state drive, the method comprising:

obtaining a printed circuit board assembly (PCBA) having a plurality of NOT AND (NAND) devices and a controller;

creating an adaptable intermediate structure, the creating the adaptable intermediate structure comprising thermally connecting a plurality of heatsinks to the NAND devices and a controller heatsink to the controller;

thermally connecting the controller heatsink to a top enclosure; and coupling a bottom enclosure to the top enclosure to form a housing for the PCBA;

the top enclosure and the bottom enclosure remaining unchanged for different PCBA configurations and the adaptable intermediate structure configured to accommodate the different PCBA configurations by adapting at least one of the plurality of heatsinks or a location of at least one of the plurality of heatsinks without changing the top enclosure or the bottom enclosure.

18. The method of claim 17, further comprising:

thermally connecting one or more of the plurality of heatsinks to the top enclosure.

19. The method of claim 17, wherein the top enclosure comprises a plurality of vents located in a front surface and a rear surface, the plurality of vents configured to allow air to flow through an interior of the housing.

20. The method of claim 17, further comprising using a same top enclosure design as the top enclosure and a same bottom enclosure design as the bottom enclosure for a different PCBA having at least one different NAND device or a different controller or having a different location for at least one of the plurality of NAND devices or the controller by creating a new intermediate structure customized to the different PCBA.

* * * * *